United States Patent
Kato et al.

(10) Patent No.: US 12,252,634 B2
(45) Date of Patent: Mar. 18, 2025

(54) POLYURETHANE FOR POLISHING LAYERS, POLISHING LAYER AND POLISHING PAD

(71) Applicant: KURARAY CO., LTD., Kurashiki (JP)

(72) Inventors: Mitsuru Kato, Kurashiki (JP); Chihiro Okamoto, Kurashiki (JP); Shinya Kato, Tokyo (JP)

(73) Assignee: KURARAY CO., LTD., Kurashiki (JP)

(*) Notice: Subject to any disclaimer, the term of this patent is extended or adjusted under 35 U.S.C. 154(b) by 997 days.

(21) Appl. No.: 17/288,579

(22) PCT Filed: Sep. 3, 2019

(86) PCT No.: PCT/JP2019/034512
§ 371 (c)(1),
(2) Date: Apr. 26, 2021

(87) PCT Pub. No.: WO2020/115968
PCT Pub. Date: Jun. 11, 2020

(65) Prior Publication Data
US 2021/0388234 A1  Dec. 16, 2021

(30) Foreign Application Priority Data
Dec. 3, 2018  (JP) ................................ 2018-226291

(51) Int. Cl.
| | |
|---|---|
| *C08G 18/28* | (2006.01) |
| *B24B 37/22* | (2012.01) |
| *B24B 37/24* | (2012.01) |
| *C08G 18/48* | (2006.01) |
| *C08G 18/76* | (2006.01) |
| *C09G 1/16* | (2006.01) |

(52) U.S. Cl.
CPC ............... *C09G 1/16* (2013.01); *B24B 37/22* (2013.01); *B24B 37/24* (2013.01); *C08G 18/283* (2013.01); *C08G 18/2835* (2013.01); *C08G 18/4825* (2013.01); *C08G 18/7671* (2013.01)

(58) Field of Classification Search
CPC .............. C08G 18/283; C08G 18/2835; C08G 18/4825
See application file for complete search history.

(56) References Cited

U.S. PATENT DOCUMENTS

| | | | | |
|---|---|---|---|---|
| 4,079,028 A | * | 3/1978 | Emmons | A61K 47/34 528/68 |
| 4,971,882 A | * | 11/1990 | Jugle | G03G 9/08782 430/119.86 |
| 5,594,087 A | * | 1/1997 | Konig | C08G 18/4833 528/85 |
| 2002/0010232 A1 | | 1/2002 | Ogawa et al. | |
| 2009/0298392 A1 | * | 12/2009 | Okamoto | C08G 18/4854 521/97 |
| 2013/0035021 A1 | | 2/2013 | Doura et al. | |
| 2013/0078892 A1 | | 3/2013 | Sato et al. | |
| 2016/0083540 A1 | * | 3/2016 | Makal | C08G 18/2825 428/221 |
| 2019/0232460 A1 | | 8/2019 | Takegoshi et al. | |

FOREIGN PATENT DOCUMENTS

| | | | | |
|---|---|---|---|---|
| CN | 105170019 A | | 12/2015 | |
| JP | 05295327 A | * | 11/1993 | |
| JP | 2000034416 A | | 2/2000 | |
| JP | 2000248046 A | * | 9/2000 | ............. C08G 18/83 |
| JP | 2001047355 A | | 2/2001 | |
| JP | 2001334455 A | | 12/2001 | |
| JP | 2003128910 A | | 5/2003 | |
| JP | 2004042250 A | | 2/2004 | |
| JP | 2005068175 A | | 3/2005 | |
| JP | 2007063323 A | | 3/2007 | |
| WO | WO-2011118505 A1 | | 9/2011 | |
| WO | WO-2011142177 A1 | | 11/2011 | |
| WO | WO-2018021428 A1 | | 2/2018 | |

OTHER PUBLICATIONS

Extended European Search Report issued Jul. 20, 2022 in European Patent Application No. 19893889.6, 6 pages.
International Search Report issued Nov. 12, 2019 in PCT/JP2019/034512 (with English translation), 5 pages.

* cited by examiner

*Primary Examiner* — Michael L Leonard
(74) *Attorney, Agent, or Firm* — Element IP, PLC

(57) ABSTRACT

Disclosed are a polyurethane for use in a polishing layer, and a polishing layer and a polishing pad using the same, the polyurethane including a terminal group represented by the following formula (I): R—(OX)$_n$— (I) wherein R represents a monovalent hydrocarbon group having 1 to 30 carbon atoms that may be substituted with a heteroatom or may be interrupted by a heteroatom, X represents an alkylene group having 2 to 4 carbon atoms, 90 to 100% of the alkylene group being an ethylene group, and n represents a number from 8 to 120.

14 Claims, No Drawings

POLYURETHANE FOR POLISHING LAYERS, POLISHING LAYER AND POLISHING PAD

TECHNICAL FIELD

The present invention relates to a polyurethane that can be suitably used as a material of a polishing layer of a polishing pad, a polishing layer using the polyurethane, and a polishing pad using the polyurethane and the polishing layer.

BACKGROUND ART

Conventionally, chemical mechanical polishing (CMP), in which a surface to be polished is polished with a polishing pad using a polishing slurry, has been used in order to mirror-finish a substrate material such as a semiconductor and a silicon wafer, a hard disk, a liquid crystal display, and glass, which is a material of a lens, and to planarize unevenness caused by an insulating film or a metal film in the production process of semiconductor devices. In CMP, there is a need for higher precision and cost reduction. Therefore, it is desired to achieve even higher performance, including, for example, less surface scratches, a higher polishing rate and increased stability thereof, and also a long-term usability, while ensuring the levels of planarization performance and smoothness higher than those in the past. In particular, in the production of semiconductor devices, with an increase in the level of integration and the number of multilayered interconnections in recent years, there is a strong demand for improvement in planarization performance, the properties of planarizing a surface of a material to be polished (hereinafter also referred to as a "surface to be polished") with a small amount of polishing or in a short polishing time, scratch resistance, the properties of being less likely to scratch a surface to be polished during polishing.

As polishing pads, a polishing pad using a non-woven fabric-type polishing layer obtained by impregnating a non-woven fabric with a polyurethane resin, and a polishing pad using a foamed polyurethane-type polishing layer produced by foaming and molding a two-liquid curable polyurethane, and subsequently grinding or slicing the polyurethane as needed are known. In general, a non-woven fabric-type polishing layer has low elasticity and is soft, and a foamed polyurethane-type polishing layer has high elasticity and is highly rigid.

The conventional polishing pad using the non-woven fabric-type polishing layer has a surface coming into contact with a surface to be polished (hereinafter also referred to as a "polishing surface") and the surface is softer than that of a polishing pad using the foamed polyurethane-type polishing layer, and therefore is superior in low-scratch property. However, due to the low elasticity, the conventional non-woven fabric-type polishing pad was inferior in planarization performance. Furthermore, the polyurethane resin impregnated into the non-woven fabric tends to be present nonuniformly in the thickness direction, so that the polishing characteristics may change over time as the polishing layer wears.

On the other hand, a polishing pad using a foamed polyurethane-type polishing layer has high rigidity, and therefore exhibits high planarization performance. However, the polishing pad was inferior in low-scratch property, because load is likely to be locally imposed on the projections of a surface to be polished, and polishing debris are likely to be accumulated in pores. Furthermore, the reaction and the foaming of the foamed polyurethane are nonuniform during production, and therefore the foam structure tends to vary. The variation in the foam structure causes a variation in the polishing characteristics such as the polishing rate and the planarization performance.

There is a need for a polishing layer having both excellent planarization performance and low-scratch property that solve the respective problems of the non-woven fabric-type polishing layer and the foamed polyurethane-type polishing layer. However, with the conventional foamed polyurethane-type polishing layer and non-woven fabric-type polishing layer, it is difficult to satisfy such a need. In order to further enhance the planarization performance of the foamed polyurethane-type polishing layer, an even higher hardness is required. However, in general, an increased hardness of the polishing pad results in a reduction in the low-scratch property. Accordingly, in the case of the foamed polyurethane-type polishing layer, there is a trade-off between high planarization performance and excellent low-scratch property, and it is therefore difficult to obtain a polishing layer that sufficiently exhibits both excellent planarization performance and low-scratch property.

As a technique for solving such a problem, PTL 1 and PTL 2 listed below disclose a polishing layer using a sheet in which a water-soluble substance is dispersed in a water-insoluble thermoplastic polymer. PTL 3 listed below discloses a polishing layer using a sheet in which water-soluble particles are dispersed in a water-insoluble matrix material containing a cross-linked polymer. However, these polishing layers are not satisfactory in terms of achieving both high planarization performance and excellent low-scratch property. In addition, since these polishing layers each contain a water-soluble substance, there is a possibility that these substances may be dissolved during polishing, thus adversely affecting the polishing characteristics. Furthermore, the water-soluble substances are likely to be nonuniformly dispersed in a water-insoluble polymer of serving as the matrix, and therefore the polishing characteristics may vary.

PTL 4 listed below discloses a polishing pad obtained by foaming and curing a polyurethane composition that contains a urethane resin produced by copolymerizing a polyol having a hydrophilic group, such as polyethylene glycol, and that also contains a specific hydrophilic agent. Additionally, PTL 5 listed below discloses a polishing pad including a polishing layer formed of a polyurethane resin foam that contains a hydrophilic polymer polyol component having an oxyethylene unit as a raw material component and that has microcells. Also, PTL 6 listed below discloses a polishing pad including a polishing layer formed of a polyurethane resin foam having microcells, wherein the polyurethane resin foam contains, as raw material components, a hydrophobic isocyanate-terminated prepolymer (A) containing, as raw material components, a hydrophobic high-molecular weight polyol component having no hydrophilic group other than a hydroxyl group and an isocyanate component, a hydrophilic isocyanate-terminated prepolymer (B) containing, as raw material components, a hydrophilic high-molecular weight polyol component having an oxyethylene unit (—$CH_2CH_2O$—) and an isocyanate component, and a chain extender.

CITATION LIST

Patent Literatures

[PTL 1] Japanese Laid-Open Patent Publication No. 2000-34416

[PTL 2] Japanese Laid-Open Patent Publication No. 2001-47355
[PTL 3] Japanese Laid-Open Patent Publication No. 2001-334455
[PTL 4] Japanese Laid-Open Patent Publication No. 2003-128910
[PTL 5] Japanese Laid-Open Patent Publication No. 2004-42250
[PTL 6] Japanese Laid-Open Patent Publication No. 2005-68175

SUMMARY OF INVENTION

Technical Problem

It is an object of the present invention to provide a polishing layer having both a high polishing rate and excellent low-scratch property, and also exhibiting excellent planarization performance.

Solution to Problem

An aspect of the present invention is directed to a polyurethane for use in a polishing layer, including a terminal group represented by the following formula (I):

wherein R represents a monovalent hydrocarbon group having 1 to 30 carbon atoms that may be substituted with a heteroatom or may be interrupted by a heteroatom, X represents an alkylene group having 2 to 4 carbon atoms, 90 to 100% of the alkylene group being an ethylene group, and n represents a number from 8 to 120. A polishing layer using such a polyurethane as a material has both a high polishing rate and excellent low-scratch property, and also exhibits excellent planarization performance.

The polyurethane for use in a polishing layer has, at a molecular chain terminal, polyoxyalkylene, in which 90 to 100% of oxyalkylene is oxyethylene. Such a polyoxyalkylene bonded to a molecular chain terminal is likely to move to the surface of the polyurethane when the polyurethane comes into contact with water or an aqueous slurry, unlike a typical polyoxyethylene derived from a polyethylene glycol that has urethane bonds on both sides and whose mobility is restrained by the hard segment of the polyurethane. Accordingly, the surface of the polishing layer can be easily locally hydrophilized and softened, and therefore, the polishing surface has increased affinity with an aqueous slurry, and hence has enhanced slurry retention, thus exhibiting a high polishing rate. Also, the occurrence of scratches can be suppressed by softening only the polishing surface in contact with the aqueous slurry.

Preferably, the R contained in the terminal group represented by the formula (I) is an aliphatic hydrocarbon group having 1 to 22 carbon atoms, because the terminal group sufficiently maintains the hydrophilicity.

Preferably, the number of repeated units n of the terminal group oxyalkylene represented by the formula (I) is 15 to 100, in terms of excellent balance between high hydrophilicity and productivity.

Preferably, the polyurethane contains 0.005 to 0.05 mmol/g of the terminal group represented by the formula (I), or contains 1 to 10 mass % of the terminal group represented by the formula (I), in terms of excellent balance between hydrophilicity and water resistance.

Preferably, the polyurethane is a reaction product of an organic polyisocyanate (A), a polymer polyol (B), a chain extender (C), and a compound (D) represented by the following formula (II):

wherein R, X, and n are the same as those in the formula (I), $A_H$ is a hydroxyl group, an amino group, or a monovalent hydrocarbon group having 1 to 4 carbon atoms and containing the aforementioned groups.

Preferably, in the polyurethane, a ratio of nitrogen atoms derived from an isocyanate group of the organic polyisocyanate (A) is 4.6 to 6.8 mass %, because a polishing layer particularly excellent in planarization performance and low-scratch property can be obtained.

Preferably, the polymer polyol (B) contains 70 mass % or more of polytetramethylene glycol, because a polyurethane that is particularly excellent in planarization performance and low-scratch property, and also exhibits excellent transparency can be easily obtained.

Preferably, the polyurethane has a water absorption rate when swollen to saturation with warm water at 50° C., of 3% or less, because the polishing layer is less likely to be soften during polishing, and is particularly excellent in planarization performance and stability over time.

Preferably, the polyurethane has thermoplasticity, because this enables a molded body used as a polishing layer to be continuously produced by hot molding such as extrusion molding.

Another aspect of the present invention is directed to a polishing layer that is a molded body of any one of the above-described polyurethanes. Furthermore, preferably, the polishing layer is non-porous. With such a polishing layer, a polishing pad having a high polishing rate, as well as excellent planarization performance and low-scratch property can be obtained.

In order for a polishing pad to maintain the high planarization performance, it is preferable that the polishing layer as a whole has a high hardness. However, when the hardness of the entire polishing layer is increased, load is likely to be locally imposed on the projections of the surface to be polished, resulting in reduced low-scratch property. On the other hand, in order to increase the polishing rate, a polishing layer having high hydrophilicity is advantageous. However, in the case of the conventional polishing layer having high hydrophilicity, the hardness of the polishing layer is reduced over time as a result of adsorbing water, resulting in reduced planarization performance or reduced polishing rate. With the above-described polishing layer, the polishing layer as a whole is less likely to undergo a reduction in hardness even when it absorbs water, so that the polyalkylene oxide bonded to the molecular chain terminal of the polyurethane, which has high mobility only in the vicinity of the polishing surface, moves, thereby making the polishing surface likely to be hydrophilized and softened. Accordingly, by reducing the modulus of elasticity of only the polishing surface in contact with an aqueous slurry, while maintaining high hardness for the polishing layer as a whole, it is possible to maintain high low-scratch property, while maintaining a high polishing rate and high planarization performance.

Preferably, the polishing layer has a JIS-D hardness at 23° C. when immersed in warm water at 50° C. for 72 hours, of 45 to 75, in terms of particularly excellent high planarization performance and scratch resistance.

Another aspect of the present invention is directed to a polishing pad including: a polishing layer including any one of the above-described polyurethanes for use in a polishing layer, and a cushioning layer having a hardness lower than a hardness of the polishing layer.

Advantageous Effects of Invention

According to the present invention, it is possible to obtain a polishing layer having both a high polishing rate and excellent low-scratch property, and also exhibiting excellent planarization performance.

DESCRIPTION OF EMBODIMENT

Hereinafter, a polyurethane for use in a polishing layer (hereinafter also simply referred to as a "polyurethane"), a polishing layer, and a polishing pad according to an embodiment of the present invention will be described in detail.

A polyurethane according to the present embodiment includes a terminal group represented by the following formula (I):

wherein R represents a monovalent hydrocarbon group having 1 to 30 carbon atoms that may be substituted with a heteroatom or may be interrupted by a heteroatom, X represents an alkylene group having 2 to 4 carbon atoms, 90 to 100% of the alkylene group being an ethylene group, and n represents a number from 8 to 120.

The above-described polyurethane is obtained by reaction of an organic polyisocyanate (A), a polymer polyol (B), a chain extender (C), and a compound (D) represented by the following chemical formula (II):

wherein R, X, and n are the same as those in the formula (I), $A_H$ is a hydroxyl group, an amino group, or a monovalent hydrocarbon group having 1 to 4 carbon atoms and containing the aforementioned groups.

As the organic polyisocyanate (A), organic polyisocyanates that have been conventionally used for producing polyurethanes can be used without any particular limitation. Specific examples thereof include aliphatic or alicyclic diisocyanates such as tetramethylene diisocyanate, pentamethylene diisocyanate, hexamethylene diisocyanate, nonamethylene diisocyanate, isophorone diisocyanate, 4,4'-dicyclohexyl methane diisocyanate, lysine diisocyanate, cyclohexylene diisocyanate, and 1,3-or 1,4-bis(isocyanatomethyl)cyclohexane; aromatic diisocyanates such as 2,4'- or 4,4'-diphenylmethane diisocyanate, 2,4- or 2,6-tolylene diisocyanate, m- or p-phenylene diisocyanate, m- or p-xylylene diisocyanate, 1,5-naphthylene diisocyanate, 4,4'-diisocyanatobiphenyl, 3,3'-dimethyl-4,4'-diisocyanatobiphenyl, 3,3'-dimethyl-4,4'-diisocyanatodiphenyl methane, chlorophenylene-2,4-diisocyanate, and tetramethyl xylylene diisocyanate; and tri- or higher-functional polyisocyanates such as lysine triisocyanate and polymethylene polyphenyl polyisocyanate. These may be used alone or in a combination of two or more. Among these, aromatic or alicyclic diisocyanates are particularly preferable because a polishing layer having a high hardness and exhibiting excellent planarization performance can be easily obtained. Also, at least one selected from 4,4'-diphenylmethane diisocyanate, 2,4-tolylene diisocyanate, 2,6-tolylene diisocyanate, isophorone diisocyanate, and 1,4-bis(isocyanatomethyl)cyclohexane, in particular, 4,4'-diphenylmethane diisocyanate is preferable because a polishing layer having excellent abrasion resistance can be easily obtained.

As the polymer polyol (B), polymer polyols that have been conventionally used for producing polyurethanes can be used without any particular limitation. Specific examples thereof include polyether polyols such as polyethylene glycol, polypropylene glycol, polytetramethylene glycol, and polymethyltetramethylene glycol; polyester polyols such as polyethylene adipate diol, polybutylene adipate diol, polyhexamethylene adipate diol, and polycaprolactone diol; and polycarbonate polyols such as polypentamethylene carbonate diol and polyhexamethylene carbonate diol. These may be used alone or in a combination of two or more. Among these, a polyether diol or a polyester diol is preferable, and a polyether diol, in particular, at least one selected from polyethylene glycol and polytetramethylene glycol is preferable because a polishing layer that is particularly excellent in polishing rate and scratch resistance can be easily obtained.

The number-average molecular weight of the polymer polyol (B) is preferably 400 to 2000, more preferably 500 to 1500, and further preferably 600 to 1200, because this gives a polyurethane having proper hardness and modulus of elasticity, and a polishing layer excellent in balance between planarization performance and low-scratch property. Note that when the number-average molecular weight of the polymer polyol is too high, the phase separation between the soft segment and the hard segment in the resulting polyurethane becomes too significant, so that optical transmission, which is required when optically detecting the end point during polishing, tends to be reduced. In particular, it is preferable that 70 mass % or more of the polymer polyol (B) is polytetramethylene glycol having a number-average molecular weight of 600 to 1500, and it is more preferable that 80 mass % or more of the polymer polyol (B) is polytetramethylene glycol having a number-average molecular weight of 700 to 1200, because a polyurethane excellent in balance between planarization performance and scratch resistance, and having excellent optical transmission can be easily obtained. In order to further increase the hydrophilicity of the polishing layer while maintaining the abrasion resistance thereof, a portion of the polymer polyol (B) may be polyethylene glycol having a number-average molecular weight of 400 to 2000, and preferably 600 to 1500. Here, the number-average molecular weight of the polymer diol refers to a number-average molecular weight calculated based on the hydroxyl value measured in accordance with JIS K 1557.

Examples of the chain extender (C) include low-molecular weight compounds that have been conventionally used for producing polyurethanes, and that have, in the molecule, two or more active hydrogen atoms capable of reacting with an isocyanate group, and having a molecular weight of preferably 250 or less. Specific examples thereof include diols such as ethylene glycol, diethylene glycol, propylene glycol, 1,2-butanediol, 1,3-butanediol, 1,4-butanediol, 1,5-pentanediol, neopentyl glycol, 1,6-hexanediol, 3-methyl-1,5-pentanediol, 1,4-bis(β-hydroxyethoxy)benzene, 1,4-cyclohexanediol, 1,8-octanediol, 1,9-nonanediol, 2-methyl-1,8-octanediol, 1,10-decanediol, m-xylene glycol, and p-xylene glycol; diamines such as ethylenediamine, tetramethylenediamine, hexamethylenediamine, heptamethylenediamine, octamethylenediamine, nonamethylenediamine, decamethylenediamine, dodecamethylenediamine, 2,2',4- or 2,4,4'-trimethylhexamethylenediamine, 3-methylpentamethylenediamine, 1,2-cyclohexanediamine, 1,3- or 1,4-cyclohexanediamine, xylylenediamine, isophoronediamine, piperazine, tolylenediamine, xylenediamine, 4,4'-diaminodiphenylmethane, 4,4'-diaminodiphenyl ether, and 4,4'-diaminodiphenylsulfone, and tri-functional compounds such as trimethylol propane, and diethylenetriamine. These may be used alone or in a combination of two or more. Among these, organic diols having a molecular weight of 60 to 250 are preferable, and at least one selected from 1,4-butanediol, 1,5-pentanediol, 3-methyl-1,5-pentanediol, 1,6-hexanediol, 1,8-octanediol, 1,9-nonanediol, 2-methyl-1,8-octanediol, and 1,10-decanediol is preferable because a polishing layer particularly excellent in polishing rate and planarization performance can be easily obtained.

The compound (D) is a compound represented by the chemical formula (II):

$$R\text{—}(OX)_n\text{-}A_H \quad (II)$$

wherein R, X, and n are the same as those in the formula (I), and $A_H$ is a hydroxyl group, an amino group, or a monovalent hydrocarbon group having 1 to 4 carbon atoms that is substituted with a hydroxyl group or an amino group.

The hydrocarbon group R is a monovalent hydrocarbon group having 1 to 30 carbon atoms that may be substituted with a heteroatom or may be interrupted by a heteroatom, and includes a linear, branched, or cyclic, monovalent saturated or unsaturated hydrocarbon group.

The number of carbon atoms of the hydrocarbon group R is 1 to 30, and preferably 1 to 24. When the number of carbon atoms of the hydrocarbon group exceeds 30, the hydrophobicity of the hydrocarbon group R is increased, so that the hydrophilicity with an aqueous slurry is insufficient when the polyurethane is used as a polishing layer. Accordingly, the terminal group represented by the formula (I) is less likely to move to the polyurethane surface. Specific examples of such a hydrocarbon group R include saturated aliphatic hydrocarbon groups such as a methyl group (1 carbon atom), an ethyl group (2 carbon atoms), a propyl group (3 carbon atoms), a butyl group (4 carbon atoms), a pentyl group (5 carbon atoms), a hexyl group (6 carbon atoms), a heptyl group (7 carbon atoms), an octyl group (8 carbon atoms), a 2-ethylhexyl group (8 carbon atoms), a nonyl group (9 carbon atoms), a 2-methyl octyl group (9 carbon atoms), a decyl group (10 carbon atoms), an isodecyl group (10 carbon atoms), a dodecyl group (12 carbon atoms, also known as a lauryl group), a tridecyl group (13 carbon atoms), a tetradecyl group (14 carbon atoms, also known as a myristyl group), a hexadecyl group (16 carbon atoms, also known as a cetyl group), an octadecyl group (18 carbon atoms, also known as a stearyl group), a 2-octyl dodecyl group (20 carbon atoms), a docosyl group (22 carbon atoms, also known as a behenyl group), a tetracosyl group (24 carbon atoms), and an octacosyl group (28 carbon atoms); unsaturated aliphatic hydrocarbon groups such as a vinyl group (2 carbon atoms), an allyl group (3 carbon atoms), a 1-butenyl group (4 carbon atoms), a 2-butenyl group (4 carbon atoms), and an oleyl group (18 carbon atoms); cyclic saturated hydrocarbons such as a cyclopropyl group (3 carbon atoms), a cyclobutyl group (4 carbon atoms), a cyclopentyl group (5 carbon atoms), and a cyclohexyl group (6 carbon atoms); and aromatic hydrocarbon groups such as a phenyl group (6 carbon atoms), a benzyl group (7 carbon atoms), a naphthyl group (10 carbon atoms), an octyl phenyl group (14 carbon atoms), a nonyl phenyl group (15 carbon atoms), and a dodecyl phenyl group (16 carbon atoms). These groups may be substituted with a heteroatom such as an oxygen atom, a nitrogen atom, or a sulfur atom, or may be interrupted by a heteroatom. Among these, the hydrocarbon group R is preferably an aliphatic hydrocarbon group having 1 to 22 carbon atoms, because this gives a polyurethane excellent in balance between hydrophilicity and water resistance, so that a polishing layer particularly excellent in polishing rate, planarization performance, and scratch resistance can be easily obtained.

X represents an alkylene group having 2 to 4 carbon atoms, 90 to 100% of the alkylene group being an ethylene group. Specifically, 90 to 100% of oxyalkylene (OX) is oxyethylene (O—$CH_2CH_2$), and OX may contain, in the ratio of 0 to 10%, oxypropylene (O—$CH_2CH_2CH_2$) or (O—$CH_2CH(CH_3)$), or oxybutylene (O—$CH_2CH_2CH_2CH_2$) or (O—$CH_2CH(CH_2CH_3)$) or the like. When the ratio of oxyethylene(O—$CH_2CH_2$) is less than 90%, the effect of increasing the hydrophilicity is reduced. Note that the ratio of X is based on the number of X.

The number of repeated units n of (OX) is 8 to 120, and is preferably 15 to 100. When the number of repeated units n is greater than 120, the molecular weight of the hydrophilic group is too large, so that the reactivity with the organic polyisocyanate (A) may be reduced. When the number of repeated units n of oxyethylene is less than 8, the hydrophilicity is reduced, so that the effect of improving the polishing rate and the scratch resistance is reduced.

$A_H$ is a group having an active hydrogen capable of reacting with an isocyanate group, and is a hydroxyl group, an amino group, or a monovalent hydrocarbon group having 1 to 4 carbon atoms that is substituted with a hydroxyl group or an amino group. In terms of the reactivity, $A_H$ is preferably a hydroxyl group or an amino group.

As the compound (D), it is particularly preferable that the hydrocarbon group R is an aliphatic hydrocarbon group having 1 to 22 carbon atoms, and the number of repeated units n of (OX) is 15 to 100, because the polyurethane surface can be sufficiently hydrophilized even with a small amount of the compound (D), so that a polishing layer excellent in polishing rate, planarization performance, and low-scratch property can be easily obtained. More preferably, the hydrocarbon group R is a saturated aliphatic hydrocarbon group having 1 to 16 carbon atoms, and the number of repeated units n of (OX) is 18 to 60. Further preferably, the hydrocarbon group R is a saturated aliphatic hydrocarbon group having 1 to 13 carbon atoms, and the number of repeated units n of (OX) is 20 to 50.

The polyurethane contains the terminal group represented by the formula (I) at a ratio of preferably 0.005 to 0.05 mmol/g, more preferably 0.006 to 0.046 mmol/g, and particularly preferably 0.008 to 0.042 mmol/g, because this gives a polyurethane excellent in balance between hydrophilicity and water resistance. When the amount of the terminal group represented by the formula (I) is too small, the effect of increasing the hydrophilicity tends to be reduced. When the amount of the terminal group represented by the formula (I) is too large, the water resistance may become insufficient, or the molecular weight may decrease to reduce the abrasion resistance.

The ratio of nitrogen atoms derived from from the isocyanate group of the organic polyisocyanate (A) in the polyurethane is preferably 4.6 to 6.8 mass %, more preferably 4.8 to 6.5 mass %, and particularly preferably 5.0 to 6.2 mass %, because a polishing layer particularly excellent in planarization performance and low-scratch property can be obtained. When the ratio of the nitrogen atoms is too low, the hardness tends to be reduced. When the ratio of the nitrogen atoms is too high, there is a tendency that the terminal group represented by the formula (I) is less likely to move to the polyurethane surface.

The ratio of the terminal group represented by the formula (I) in the polyurethane is preferably 1 to 10 mass %, more preferably 1.2 to 9.5 mass %, and particularly preferably 1.4 to 9 mass %, because a polishing layer particularly excellent in planarization performance and low-scratch property can be obtained. When the ratio of the terminal group represented by the formula (I) is too low, the effect of improving the hydrophilicity tends to be reduced. When the ratio of the terminal group represented by the formula (I) is too high, the water resistance tends to be reduced.

When polyethylene glycol is used as the polymer polyol (B), the total content ratio of the polyoxyethylene of the terminal group represented by the formula (I) and the polyoxyethylene derived from the polyethylene glycol in the polyurethane is preferably 1.5 to 20 mass %, more preferably 2 to 15 mass %, and particularly preferably 3 to 10 mass %.

The polyurethane has a water absorption rate when swollen to saturation with warm water at 50° C., of 3% or less, more preferably 2.7% or less, and particularly preferably 2.4% or less, because the polishing layer is less likely to be softened during polishing, and is particularly excellent in planarization performance and stability over time.

The polyurethane according to the present embodiment can be produced by a known polyurethane production method, using, as a raw material, a monomer containing the organic polyisocyanate (A), the polymer polyol (B), the chain extender (C), and the compound (D). Specifically, the polyurethane can be produced, for example, by a known melt-polymerization method such as a prepolymer method or a one-shot method, or a solution polymerization method. As the melt-polymerization method, the polyurethane can be produced, for example, by melt-kneading a mixture of these monomers at a predetermined ratio substantially in the absence of a solvent, to achieve polymerization. Examples of melt-kneading include a method in which continuous melt-polymerization is performed using a multi-screw extruder. As the solution polymerization method, the polyurethane can be produced, for example, by mixing these monomers in an organic solvent at a predetermined ratio, to achieve polymerization.

Although the thus obtained polyurethane according to the present embodiment may be either a thermoplastic polyurethane or a thermosetting polyurethane, the polyurethane is preferably thermoplastic because of the superior low-scratch property. Note that thermoplasticity means the properties of being moldable through melting by a heating process such as extrusion molding, injection molding, calendering, and 3D-printer molding. The polyurethane according to the present embodiment can be molded into a sheet-like molded body or the like by a molding method that undergoes such a heating process. In particular, it is preferable to use extrusion molding with a T-die because a sheet-like molded body having a uniform thickness can be easily obtained.

It is preferable that the polyurethane molded body used as the polishing layer according to the present embodiment is non-porous (non-foam) in that an increased hardness results in particularly excellent planarization performance, the surface without pores prevents accumulation of polishing debris, thus achieving excellent low-scratch property, and the polishing layer has a low ware rate and thus can be used for a long period.

The polishing layer has a JIS-D hardness at 23° C. when immersed in warm water at 50° C. for 72 hours, of preferably 45 to 75, more preferably 48 to 72, and particularly preferably 51 to 69, because of the particularly excellent planarization performance, polishing rate, and low-scratch property.

The contact angle with water of the polishing layer after having been in contact with water for 15 minutes is preferably as low as possible, because the polishing rate is increased, and excellent scratch resistance can be achieved. Specifically, the contact angle with water after having been in contact with water for 15 minutes is preferably 44° or less, more preferably 42° or less, and particularly preferably 40° or less. When the contact angle with water of the polishing layer is 44° or less, the polishing slurry usually contains a water-soluble low-molecular weight compound, in addition to water and abrasive grains, and thus has higher wettability with the polishing surface than water, so that the contact angle with the polishing slurry tends to be very small.

The polyurethane according to the present embodiment can be used for variety of applications, but is particularly suitably used as a polishing layer of a polishing pad for polishing a semiconductor wafer, a semiconductor device, a silicon wafer, a hard disk, a glass substrate, an optical product, various metals, or the like. The thickness of the polishing layer is not particularly limited, and may be appropriately adjusted according to the layer configuration or the usage of the polishing pad. Specifically, the thickness is, for example, preferably 0.8 to 3.0 mm, more preferably 1.0 to 2.5 mm, and particularly preferably 1.2 to 2.0 mm. When a sheet-like polyurethane molded body for producing a polishing layer is molded by a molding method such as extrusion molding, injection molding, calendering, or 3D-printer molding, the sheet-like polyurethane molded body may be either non-porous or porous, but is particularly preferably non-porous.

The polishing layer is produced by adjusting the dimensions, shape, thickness and the like of the thus obtained sheet-like polyurethane molded body by cutting, slicing, buffing, punching, and the like. In order to allow a slurry to be uniformly and sufficiently supplied to the polishing surface of the polishing layer, it is preferable that recesses such as grooves or holes are formed in the polishing surface. Such recesses are also useful to discharge polishing debris that may cause scratching and to prevent a damage to a wafer as a result of adsorption of the polishing pad.

The polishing pad of the present embodiment may be either a monolayer polishing pad composed only of the polishing layer, or a multilayer polishing pad in which a cushioning layer is further stacked on the back surface of the polishing layer. Is preferable that the cushioning layer is a layer having a hardness lower than the hardness of the polishing layer, because it is possible to improve the polishing uniformity while maintaining the planarization performance.

Specific examples of materials that can be used as the cushioning layer include composites (e.g., "Suba 400" (manufactured by Nitta Haas Incorporated)) obtained by impregnating a non-woven fabric with a polyurethane; rubbers such as a natural rubber, a nitrile rubber, a polybutadiene rubber, and a silicone rubber; thermoplastic elastomers such as a polyester-based thermoplastic elastomer, a polyamide-based thermoplastic elastomer, and a fluorine-based thermoplastic elastomer; foamed plastics; and polyurethanes. Among these, a polyurethane having a foam structure is particularly preferable because flexibility desirable for the cushioning layer can be easily achieved.

The polishing pad obtained in the present embodiment can be particularly suitably used for chemical mechanical polishing or the like of a glass substrate, a semiconductor substrate, or an insulating film such as a silicon oxide film or a metal film such as a copper film formed on a semiconductor substrate.

EXAMPLES

Hereinafter, the present invention will be described in further detail by way of examples. It should be appreciated that the scope of the invention is by no means limited to the examples.

First, the organic polyisocyanate (A), the polymer polyol (B), the chain extender (C), and the compound (D) used for producing polyurethanes in Examples will be collectively shown below.

<Polyisocyanate (A)>
 4,4'-Diphenylmethane diisocyanate (MDI)

<Polymer Polyol (B)>
 Polytetramethylene glycol having a number-average molecular weight of 850 (PTG 850)
 Polytetramethylene glycol having a number-average molecular weight of 1000 (PTG 1000)
 Polyethylene glycol having a number-average molecular weight of 600 (PEG 600)
 Polyethylene glycol having a number-average molecular weight of 2000 (PEG 2000)

<Chain Extender (C)>
 1,4-Butanediol (BD)
 1,9-Nonanediol (ND)

<Compound (D)>
 MePOE4: R is a methyl group, 100% of (OX) is (O—$CH_2CH_2$), n=4
 MePOE9: R is a methyl group, 100% of (OX) is (O—$CH_2CH_2$), n=9
 MePOE23: R is a methyl group, 100% of (OX) is (O—$CH_2CH_2$), n=23
 MePOE45: R is a methyl group, 100% of (OX) is (O—$CH_2CH_2$), n=45
 MePOE91: R is a methyl group, 100% of (OX) is (O—$CH_2CH_2$), n=91
 BuPOE3: R is a butyl group, 100% of (OX) is (O—$CH_2CH_2$), n=3
 EHPOE6: R is a 2-ethylhexyl group, 100% of (OX) is (O—$CH_2CH_2$), n=6
 EHPOE30: R is a 2-ethylhexyl group, 100% of (OX) is (O—$CH_2CH_2$), n=30
 C10POE31: R is an isodecyl group, 100% of (OX) is (O—$CH_2CH_2$), n=31
 C12PO5: R is a dodecyl group, 100% of (OX) is (O—$CH_2CH_2$), n=5
 C12POE19: R is a dodecyl group, 100% of (OX) is (O—$CH_2CH_2$), n=19
 C12POE25: R is a dodecyl group, 100% of (OX) is (O—$CH_2CH_2$), n=25
 C12POE41: R is a dodecyl group, 100% of (OX) is (O—$CH_2CH_2$), n=41
 C13POE49: R is a tridecyl group, 100% of (OX) is (O—$CH_2CH_2$), n=49
 C22POE30: R is a docosyl group, 100% of (OX) is (O—$CH_2CH_2$), n=30

Note that in all of the compounds (D), $A_H$ was a hydroxyl group.

Example 1

MDI, PTG 1000, PEG 600, BD, and MePOE9 were mixed at a ratio of MDI:PTG 1000:PEG 600:BD:MePOE9=49.0:31.7:3.6:14.2:1.5 (mass ratio), to produce a urethane prepolymer. Then, the obtained urethane prepolymer was kneaded in a small-sized kneader for 5 minutes at 240° C. and a screw speed of 100 rpm, to obtain a thermoplastic polyurethane. The content of nitrogen atoms derived from the isocyanate group as calculated from the raw material blending ratio was 5.5 mass %, and the content ratio of the polyoxyethylene was 5.0 mass %. The ratio of the terminal group R—$(OX)_n$— in the polyurethane was 1.5 mass %, and 0.038 mmol/g. The saturated water absorption rate at 50° C. of the polyurethane was evaluated by the following method.

<Saturated Water Absorption Rate After Immersed in Water at 50° C.>

A film having a thickness of about 300 μm was formed by hot pressing, and the film was subsequently allowed to stand for 3 days at 25° C. and 50% RH. The mass after standing was measured as a mass in a dry state. Then, the dried film was immersed in ion exchanged water at 50° C. Immediately after taking out the film from the water at 50° C., excess water droplets on the film surface were wiped off, and the mass after water absorption was measured. The mass of the sample was measured every two days until the mass saturated, and the mass after water absorption when the mass stopped changing was determined as a mass after saturated water absorption. The water absorption rate calculated by the following expression was 1.7 mass %.

Water absorption rate (%)=[(Mass after saturated water absorption−Mass in dry state)/Mass in dry state]×100

Then, the obtained polyurethane was formed into a non-porous sheet having a thickness of about 2 mm by vacuum hot pressing, followed by grinding of the surface of the polyurethane sheet, to give a polyurethane molded body having a thickness of 1.5 mm. The JIS-D hardness at 23° C. after the polyurethane molded body had been immersed in warm water at 50° C. for 72 hours, and the contact angle were evaluated by the following methods.

<JIS-D Hardness at 23° C. After Immersed in Water at 50° C. for 72 Hours>

The polyurethane molded body was immersed in ion exchanged water at 50° C. for 72 hours, and was subsequently immersed in water at 23° C. for 30 minutes. Immediately after taking out the polyurethane molded body from the water, excess water droplets on the surface were wiped off, and then the hardness was measured by a durometer hardness test (type D) in accordance with JIS K 6253. The D hardness was 54.

<Contact Angle with Water>

The polyurethane molded body was allowed to stand for 3 days at 20° C. and 65% RH. Then, using a DropMaster500 manufactured by Kyowa Interface Science Co., Ltd., water droplets were added dropwise onto the polyurethane molded body, and the contact angle with water after 15 minutes from the dropwise addition was measured. The contact angle was 40 degrees.

Next, in the main surface, which would serve as a polishing surface, of the polyurethane molded body having a thickness of 1.5 mm, grooves each having a width of 0.5 mm and a depth of 1.0 mm were spirally formed at intervals of 3.0 mm. Then, the polyurethane molded body was cut out into a circular shape having a diameter of 38 cm, to produce a polishing layer. Then, a cushioning layer was attached to the back surface of the polishing layer with a double-sided pressure-sensitive adhesive sheet, to form a multilayer polishing pad. As the cushioning layer, a "PORON H48" manufactured by INOAC Corporation, a foamed polyurethane sheet having a thickness of 0.8 mm, was used. Then, the polishing characteristics of the obtained polishing pad were evaluated by the following evaluation methods.

<Polishing Rate, Scratches>

The obtained polishing pad was mounted to a polishing device "MAT-BC15" manufactured by MAT Inc. Then, using a diamond dresser (diamond grid number: #60, metal base diameter: 19 cm) manufactured by A.L.M.T. Corp., the surface of the polishing pad was conditioned for 60 minutes at a dresser rotation rate of 140 rpm, a polishing pad rotation rate of 100 rpm, and a dresser load of 5 N, while pouring pure water at a rate of 150 mL/min. Next, a polishing slurry having a pH of 12 obtained by diluting two-fold a polishing slurry "SS-25" manufactured by Cabot Microelectronics Corp. was prepared. Then, while supplying the polishing slurry onto the polishing surface of the polishing pad at a rate of 80 mL/min, a 4-inch-diameter silicon wafer having a silicon oxide film with a thickness of 1000 nm on the surface thereof was polished for 60 seconds at a platen rotation rate of 100 rpm, a head rotation rate of 99 rpm, and a polishing pressure of 41.4 kPa. Then, after being polished for 60 seconds, the polishing pad was conditioned for 30 seconds. Then, another silicon wafer was polished with the polishing pad, and the polishing pad was further conditioned for 30 seconds. In this manner, 10 silicon wafers were polished.

Then, the thicknesses before and after polishing of the silicon oxide film on the tenth polished silicon wafer were measured, and the polishing rate was determined. The polishing rate was 299 nm/min. The tenth polished wafer was observed at randomly selected 100 locations using a laser microscope "VKX-200" manufactured by KEYENCE CORPORATION, with an object lens magnification of X1000, and the presence or absence of scratches was determined. No scratches were observed.

<Planarization Performance>

One patterned wafer for STI polishing evaluation "SKW3-2" manufactured by SKW, having a concave and convex pattern formed by alternately and repeatedly arranged convex parts and concave parts, was polished under the same conditions as above. Note that this patterned wafer has concave and convex pattern regions with various widths and pitches. Each convex part of the pattern has a structure including a 15 nm-thick silicon oxide film stacked on a silicon wafer, a 170 nm-thick silicon nitride film stacked on the silicon oxide film, and a 700 nm-thick silicon oxide film (an HDP silicon oxide film formed by high-density plasma chemical vapor deposition) further stacked on the silicon nitride film. Each concave part of the pattern has a structure formed by etching a silicon wafer 300 nm to form a groove, and subsequently forming a 700 nm-thick HDP silicon oxide film. As an object to be evaluated, a region formed by a pattern of convex parts each having a width of 30 μm and concave parts each having a width of 70 μm was selected. The patterned wafer was polished for the time for the silicon oxide film, stacked on the silicon nitride film on the convex parts of the pattern, to be disappeared, and was further polished for an additional time corresponding to 10% of the aforementioned time. The step height in the above-described pattern after polishing was measured using a surface roughness tester ("SJ-400" manufactured by Mitutoyo Corporation), under the settings: standard stylus; measurement range 80 μm, JIS 2001, Gaussian filter; cut off length λc 2.5 mm; and a cut off length λs 8.0 μm, and the step height determined from a primary profile was 65 nm. The smaller the step height, the more excellent the planarization performance is.

The results are shown in Table 1 below.

TABLE 1

| Example No. | | Ex. 1 | Ex. 2 | Ex. 3 | Ex. 4 | Ex. 5 | Ex. 6 |
|---|---|---|---|---|---|---|---|
| Type of compound (D) | | MePOE9 | MePOE45 | MePOE45 | C10POE31 | C12PEO25 | C12PEO25 |
| Ratio of compound (D) in polyurethane raw material | [mass %] | 1.5 | 1.5 | 4.8 | 6.2 | 1.7 | 3.6 |
| | [mmol/g] | 0.038 | 0.008 | 0.024 | 0.042 | 0.013 | 0.028 |
| Composition of polyurethane raw material [mass %] | MDI | 49.0 | 48.9 | 49.0 | 49.0 | 49.0 | 49.0 |
| | PTG 1000 | 31.7 | 31.7 | 31.3 | 30.0 | 31.3 | 31.2 |
| | PEG 600 | 3.6 | 3.4 | — | — | 3.6 | 1.6 |
| | PEG 2000 | — | — | — | — | — | — |
| | BD | 14.2 | 14.5 | 14.9 | 14.8 | 14.4 | 14.6 |
| | Compound (D) | 1.5 | 1.5 | 4.8 | 6.2 | 1.7 | 3.6 |
| Content ratio of nitrogen atoms derived from isocyanate group [mass %] | | 5.5% | 5.5% | 5.5% | 5.5% | 5.5% | 5.5% |
| Content ratio of terminal polyoxyethylene [mass %] | | 5.0% | 4.9% | 4.7% | 5.7% | 5.1% | 4.7% |
| Water absorption ratio when swollen to saturation with warm water at 50° C. [%] | | 1.7% | 1.9% | 2.3% | 2.2% | 1.9% | 1.6% |
| JIS-D hardness at 23° C. when swollen to saturation with warm water at 50° C. | | 54 | 54 | 54 | 53 | 54 | 54 |
| Contact angle after elapse of 15 minutes [degrees] | | 40 | 40 | 38 | 40 | 38 | 34 |
| Polishing rate [nm/min] | | 299 | 305 | 316 | 301 | 321 | 336 |
| Scratches | | Absent | Absent | Absent | Absent | Absent | Absent |
| Step Height [nm] | | 65 | 60 | 60 | 60 | 60 | 60 |

| Example No. | | Ex. 7 | Com. Ex. 1 | Com. Ex. 2 | Com. Ex. 3 | Com. Ex. 4 |
|---|---|---|---|---|---|---|
| Type of compound (D) | | C22PEO30 | — | — | — | MePOE4 |
| Ratio of compound (D) in polyurethane raw material | [mass %] | 1.7 | — | — | — | 1.0 |
| | [mmol/g] | 0.010 | — | — | — | 0.048 |

TABLE 1-continued

| | | | | | | |
|---|---|---|---|---|---|---|
| Composition of polyurethane raw material [mass %] | MDI | 49.0 | 49.0 | 49.1 | 49.0 | 49.0 |
| | PTG 1000 | 31.2 | 31.9 | 27.6 | 31.4 | 31.4 |
| | PEG 600 | 3.6 | 4.8 | 9.3 | — | 4.7 |
| | PEG 2000 | — | — | — | 4.7 | — |
| | BD | 14.5 | 14.3 | 14.0 | 14.9 | 13.9 |
| | Compound (D) | 1.7 | — | — | — | 1.0 |
| Content ratio of nitrogen atoms derived from isocyanate group [mass %] | | 5.5% | 5.5% | 5.5% | 5.5% | 5.5% |
| Content ratio of terminal polyoxyethylene [mass %] | | 5.0% | 4.8% | 9.3% | 4.7% | 5.5% |
| Water absorption ratio when swollen to saturation with warm water at 50° C. [%] | | 2.0% | 2.3% | 3.4% | 2.9% | 2.2% |
| JIS-D hardness at 23° C. when swollen to saturation with warm water at 50° C. | | 54 | 54 | 51 | 52 | 54 |
| Contact angle after elapse of 15 minutes [degrees] | | 38 | 46 | 41 | 42 | 45 |
| Polishing rate [nm/min] | | 310 | 265 | 251 | 259 | 271 |
| Scratches | | Absent | Absent | Absent | Absent | Absent |
| Step Height [nm] | | 65 | 70 | 80 | 75 | 70 |

Examples 2 to 7, Comparative Examples 1 to 4

Polyurethanes were produced in the same manner as in Example 1 except that the compositions of the polyurethane monomer mixtures were changed to the compositions shown in Table 1. Then, polyurethane molded bodies, polishing layers, and polishing pads were formed in the same manner as in Example 1, and they were evaluated in the same manner as in Example 1. The results are shown in Table 1.

The results in Table 1 demonstrate the following. The polishing layers using the polyurethanes obtained in Examples 1 to 7, which had a terminal group in which the number of repeated units n of oxyethylene ($O-CH_2CH_2$) was in the range of 8 to 120, had a low contact angle with water despite having a low saturated water absorption rate when immersed in water at 50° C. Accordingly, these polishing layers exhibited high surface hydrophilicity, high polishing rate, low-scratch property, and high planarization performance, while the softening thereof by water absorption was kept suppressed. On the other hand, the polishing layers using the polyurethanes obtained in Comparative Examples 1 to 3, which did not have a terminal group having polyoxyethylene, and the polishing layer using the polyurethane obtained in Comparative Example 4, in which the number of repeated units n of oxyethylene was less than 8, exhibited a high saturated water absorption rate when immersed in water at 50° C., or a high contact angle with water. Accordingly, the polishing layers had low surface hydrophilicity, or were softened by water absorption, and thus had a low polishing rate, and were also inferior in planarization performance.

Examples 8 to 14, Comparative Examples 5 to 8

Polyurethane were produced in the same manner as in Example 1 except that the compositions of the polyurethane monomer mixtures were changed to the compositions shown in Table 2. Then, polyurethane molded bodies, polishing layers, and polishing pads were formed in the same manner as in Example 1. Then, they were evaluated in the same manner as in Example 1 except that a diamond dresser having a diamond grid number of #100 was used, and that a region formed by a pattern of convex parts each having a width of 100 μm and concave parts each having a width of 100 μm was selected as a concave and convex pattern to be evaluated. The results are shown in Table 2 below.

TABLE 2

| Example No. | | Ex. 8 | Ex. 9 | Ex. 10 | Ex. 11 | Ex. 12 | Ex. 13 |
|---|---|---|---|---|---|---|---|
| Type of compound (D) | | MePOE23 | MePOE45 | MePOE91 | EHPEO30 | C12PEO25 | C12PEO25 |
| Ratio of compound (D) in polyurethane raw material | [mass %] | 3.0 | 3.0 | 3.0 | 2.1 | 1.8 | 4.0 |
| | [mmol/g] | 0.030 | 0.015 | 0.008 | 0.014 | 0.014 | 0.031 |
| Composition of polyurethane raw material [mass %] | MDI | 51.6 | 51.7 | 51.7 | 51.6 | 51.6 | 51.5 |
| | PTG 850 | 30.0 | 29.7 | 29.6 | 30.8 | 31.1 | 29.0 |
| | PEG 600 | — | — | — | — | — | — |
| | PEG 2000 | — | — | — | — | — | — |
| | BD | 15.4 | 15.6 | 15.7 | 15.5 | 15.5 | 15.5 |
| | Compound (D) | 3.0 | 3.0 | 3.0 | 2.1 | 1.8 | 4.0 |
| Content ratio of nitrogen atoms derived from isocyanate group [mass %] | | 5.8% | 5.8% | 5.8% | 5.8% | 5.8% | 5.8% |
| Content ratio of terminal polyoxyethylene [mass %] | | 2.9% | 3.0% | 3.0% | 1.9% | 1.5% | 3.4% |
| Water absorption ratio when swollen to saturation with warm water at 50° C. [%] | | 1.7% | 2.1% | 2.3% | 2.3% | 1.5% | 1.8% |
| JIS-D hardness at 23° C. when swollen to saturation with warm water at 50° C. | | 60 | 60 | 60 | 60 | 61 | 60 |

TABLE 2-continued

| | | | | | | |
|---|---|---|---|---|---|---|
| Contact angle after elapse of 15 minutes [degrees] | 44 | 42 | 41 | 44 | 42 | 39 |
| Polishing rate [nm/min] | 395 | 412 | 421 | 383 | 400 | 434 |
| Scratches | Absent | Absent | Absent | Absent | Absent | Absent |
| Step Height [nm] | 60 | 55 | 50 | 60 | 55 | 50 |

| Example No. | | Ex. 14 | Com. Ex. 5 | Com. Ex. 6 | Com. Ex. 7 | Com. Ex. 8 |
|---|---|---|---|---|---|---|
| Type of compound (D) | | C22PEO30 | — | — | — | — |
| Ratio of compound (D) in polyurethane raw material | [mass %] | 1.9 | — | — | — | — |
| | [mmol/g] | 0.012 | — | — | — | — |
| Composition of polyurethane raw material [mass %] | MDI | 51.7 | 51.7 | 51.6 | 51.7 | 51.7 |
| | PTG 850 | 30.9 | 32.9 | 31.8 | 30.0 | 29.7 |
| | PEG 600 | — | — | 1.2 | 3.0 | — |
| | PEG 2000 | — | — | — | — | 3.0 |
| | BD | 15.5 | 15.4 | 15.4 | 15.3 | 15.6 |
| | Compound (D) | 1.9 | — | — | — | — |
| Content ratio of nitrogen atoms derived from isocyanate group [mass %] | | 5.8% | 5.8% | 5.8% | 5.8% | 5.8% |
| Content ratio of terminal polyoxyethylene [mass %] | | 1.5% | 0.0% | 1.2% | 3.0% | 3.0% |
| Water absorption ratio when swollen to saturation with warm water at 50° C. [%] | | 1.5% | 1.6% | 1.7% | 1.9% | 1.9% |
| JIS-D hardness at 23° C. when swollen to saturation with warm water at 50° C. | | 60 | 62 | 60 | 59 | 58 |
| Contact angle after elapse of 15 minutes [degrees] | | 44 | 52 | 51 | 50 | 49 |
| Polishing rate [nm/min] | | 407 | 316 | 324 | 333 | 341 |
| Scratches | | Absent | Present | Present | Absent | Absent |
| Step Height [nm] | | 60 | 65 | 65 | 65 | 70 |

The results in Table 2 demonstrate the following. The polishing layers using the polyurethanes obtained in Examples 8 to 14, which had a terminal group in which the number of repeated units n of oxyethylene was in the range of 8 to 120, had a low contact angle with water despite having a low saturated water absorption rate when immersed in water at 50° C. Accordingly, these polishing layers exhibited high surface hydrophilicity, high polishing rate, low-scratch property, and high planarization performance, while the softening thereof by water absorption was kept suppressed. On the other hand, the polishing layers using the polyurethanes obtained in Comparative Examples 5 to 8, which did not have a terminal group having polyoxyethylene, exhibited low surface hydrophilicity and a low polishing rate, and were inferior in planarization performance and low-scratch property.

Examples 15 to 21, Comparative Examples 9 to 12

Polyurethanes were produced in the same manner as in Example 1 except that the compositions of the polyurethane monomer mixtures were changed to the compositions shown in Table 3. Note that in Example 21, the two types of compounds shown in Table 3 were used as the compound (D). Then, polyurethane molded bodies, polishing layers, and polishing pads were formed in the same manner as in Example 1. Then, they were evaluated in the same manner as in Example 1 except that a diamond dresser having a diamond grid number of #100 was used. The results are shown in Table 3 below.

TABLE 3

| Example No. | | Ex. 15 | Ex. 16 | Ex. 17 | Ex. 18 | Ex. 19 | Ex. 20 |
|---|---|---|---|---|---|---|---|
| Type of compound (D) | | MePOE45 | MePOE45 | MePOE91 | C12PEO19 | C12PEO25 | C12PEO41 |
| Ratio of compound (D) in polyurethane raw material | [mass %] | 4.3 | 3.8 | 2.8 | 2.4 | 5.0 | 4.7 |
| | [mmol/g] | 0.022 | 0.019 | 0.007 | 0.023 | 0.039 | 0.024 |
| Composition of polyurethane raw material [mass %] | MDI | 46.3 | 46.2 | 46.3 | 46.3 | 46.3 | 46.4 |
| | PTG 850 | 24.1 | 21.4 | 22.5 | 21.6 | 23.7 | 23.6 |
| | PEG 600 | — | 3.8 | — | 2.4 | — | — |
| | PEG 2000 | — | — | 2.8 | 2.4 | — | — |
| | ND | 25.3 | 24.8 | 25.6 | 24.9 | 25.0 | 25.3 |
| | Compound (D) | 4.3 | 3.8 | 2.8 | 2.4 | 5.0 | 4.7 |
| Content ratio of nitrogen atoms derived from isocyanate group [mass %] | | 5.2% | 5.2% | 5.2% | 5.2% | 5.2% | 5.2% |
| Content ratio of terminal polyoxyethylene [mass %] | | 4.2% | 7.5% | 5.6% | 6.8% | 4.3% | 4.3% |

TABLE 3-continued

| | | | | | | |
|---|---|---|---|---|---|---|
| Water absorption ratio when swollen to saturation with warm water at 50° C. [%] | 1.7% | 1.9% | 2.3% | 1.4% | 1.5% | 1.4% |
| JIS-D hardness at 23° C. when swollen to saturation with warm water at 50° C. | 58 | 57 | 57 | 58 | 58 | 58 |
| Contact angle after elapse of 15 minutes [degrees] | 43 | 42 | 42 | 42 | 38 | 40 |
| Polishing rate [nm/min] | 370 | 381 | 388 | 393 | 412 | 395 |
| Scratches | Absent | Absent | Absent | Absent | Absent | Absent |
| Step Height [nm] | 65 | 60 | 60 | 55 | 55 | 55 |

| Example No. | | | Ex. 21 | Com. Ex. 9 | Com. Ex. 10 | Com. Ex. 11 | Com. Ex. 12 |
|---|---|---|---|---|---|---|---|
| Type of compound (D) | | | (1) MePOE45 (2) C13PEO49 | — | — | — | EHPOE6 |
| Ratio of compound (D) in polyurethane raw material | [mass %] | | 6.2 | — | — | — | 2.7 |
| | [mmol/g] | | 0.029 | — | — | — | 0.069 |
| Composition of polyurethane raw material [mass %] | MDI | | 46.1 | 46.3 | 46.3 | 46.2 | 46.2 |
| | PTG 850 | | 22.2 | 29.0 | 21.6 | 24.3 | 27.1 |
| | PEG 600 | | — | — | 8.2 | — | — |
| | PEG 2000 | | — | — | — | 4.3 | — |
| | ND | | 25.5 | 24.7 | 23.9 | 25.2 | 24.0 |
| | Compound (D) | | (1) 3.1 (2) 3.1 | — | — | — | 2.7 |
| Content ratio of nitrogen atoms derived from isocyanate group [mass %] | | | 5.2% | 5.2% | 5.2% | 5.2% | 5.2% |
| Content ratio of terminal polyoxyethylene [mass %] | | | 5.9% | 0.0% | 8.2% | 4.3% | 1.8% |
| Water absorption ratio when swollen to saturation with warm water at 50° C. [%] | | | 2.2% | 1.4% | 1.8% | 1.7% | 1.4% |
| JIS-D hardness at 23° C. when swollen to saturation with warm water at 50° C. | | | 57 | 59 | 56 | 57 | 59 |
| Contact angle after elapse of 15 minutes [degrees] | | | 39 | 56 | 52 | 51 | 55 |
| Polishing rate [nm/min] | | | 401 | 288 | 328 | 330 | 287 |
| Scratches | | | Absent | Present | Absent | Absent | Present |
| Step Height [nm] | | | 55 | 70 | 70 | 70 | 65 |

The results in Table 3 demonstrate the following. The polishing layers using the polyurethanes obtained in Examples 15 to 21, which had a terminal group in which the number of repeated units n of oxyethylene was in the range of 8 to 120, had a low contact angle with water despite having a low saturated water absorption rate when immersed in water at 50° C. Accordingly, these polishing layers exhibited high surface hydrophilicity, high polishing rate, low-scratch property, and high planarization performance, while the softening thereof by water absorption was kept suppressed. On the other hand, the polishing layers using the polyurethanes obtained in Comparative Examples 9 to 11, which did not have a terminal group having polyoxyethylene, and the polishing layer using the polyurethane obtained in Comparative Example 12, in which the number of repeated units n of oxyethylene was less than 8, had a high contact angle with water. Accordingly, these polishing layers exhibited low surface hydrophilicity, a reduced polishing rate, and were inferior in planarization performance and low-scratch property.

Examples 22 to 25, Comparative Examples 13 to 19

Polyurethanes were produced in the same manner as in Example 1 except that the compositions of the polyurethane monomer mixtures were changed to the composition shown in Table 4. Then, polyurethane molded bodies were formed in the same manner as in Example 1. Then, polishing layers and polishing pads were formed in the same manner as in Example 1 except that, in the main surface, which would serve as a polishing surface, of each of the polyurethane molded bodies, grooves each having a width of 1.0 mm and a depth of 1.0 mm were spirally formed at intervals of 6.0 mm. Then, evaluation was performed in the same manner as in Example 1 except that a diamond dresser having a diamond grid number of #200 was used, and that a region formed by a pattern of convex parts each having a width of 250 μm and concave parts each having a width of 250 μm was selected as a concave and convex pattern to be evaluated. The results are shown in Table 4 below.

TABLE 4

| Example No. | | Ex. 22 | Ex. 23 | Ex. 24 | Ex. 25 | Com. Ex. 13 | Con. Ex. 14 |
|---|---|---|---|---|---|---|---|
| Type of compound (D) | | MePOE45 | MePOE91 | C12PEO41 | C13PEO49 | — | — |
| Ratio of (D) to polyurethane | [mass %] | 6.8 | 6.8 | 7.5 | 7.4 | — | — |
| | [nmol/g] | 0.034 | 0.017 | 0.038 | 0.031 | — | — |
| Composition of polyurethane raw material [mass %] | MDI | 54.4 | 54.3 | 54.3 | 54.4 | 54.4 | 54.4 |
| | PTG 850 | 21.6 | 21.5 | 21.0 | 20.9 | 28.9 | 22.4 |
| | PEG 600 | — | — | — | — | — | 6.8 |
| | PEG 2000 | — | — | — | — | — | — |
| | BD | 17.2 | 17.4 | 17.2 | 17.3 | 16.7 | 16.4 |
| | Compound (D) | 6.8 | 6.8 | 7.5 | 7.4 | — | — |
| Content ratio of nitrogen atoms derived from isocyanate group [mass %] | | 6.1% | 6.1% | 6.1% | 6.1% | 6.1% | 6.1% |
| Content ratio of terminal polyoxyethylene[mass %] | | 6.7% | 6.7% | 6.8% | 6.8% | 0.0% | 6.8% |
| Water absorption ratio when swollen to saturation with warm water at 50° C. (%) | | 1.9% | 2.0% | 1.7% | 2.1% | 1.9% | 2.2% |
| JIS-D hardness at 23° C. when swollen to saturation with warm water at 50° C. | | 69 | 68 | 68 | 68 | 70 | 68 |
| Contact angle after elapse of 15 minutes [degrees] | | 42 | 41 | 39 | 40 | 51 | 46 |
| Polishing rate [nm/min] | | 357 | 363 | 374 | 351 | 253 | 280 |
| Scratches | | Absent | Absent | Absent | Absent | Present | Absent |
| Step Height [nm] | | 95 | 90 | 90 | 95 | 115 | 110 |

| Example No. | | Com. Ex. 15 | Con. Ex. 16 | Com. Ex. 17 | Con. Ex. 18 | Com. Ex. 19 |
|---|---|---|---|---|---|---|
| Type of compound (D) | | — | MePOE4 | BuPOE3 | EHPOE6 | C12POE5 |
| Ratio of (D) to polyurethane | [mass %] | — | 1.2 | 1.0 | 2.1 | 2.0 |
| | [nmol/g] | — | 0.058 | 0.049 | 0.053 | 0.049 |
| Composition of polyurethane raw material [mass %] | MDI | 54.4 | 54.3 | 54.2 | 54.3 | 54.4 |
| | PTG 850 | 21.6 | 23.0 | 22.2 | 22.2 | 21.2 |
| | PEG 600 | — | 5.4 | — | 5.2 | — |
| | PEG 2000 | 6.8 | — | 5.8 | — | 5.5 |
| | BD | 17.2 | 16.1 | 16.8 | 16.2 | 16.9 |
| | Compound (D) | — | 1.2 | 1.0 | 2.1 | 2.0 |
| Content ratio of nitrogen atoms derived from isocyanate group [mass %] | | 6.1% | 6.1% | 6.1% | 6.1% | 6.1% |
| Content ratio of terminal polyoxyethylene[mass %] | | 6.8% | 6.4% | 6.4% | 6.6% | 6.6% |
| Water absorption ratio when swollen to saturation with warm water at 50° C. (%) | | 2.4% | 2.1% | 2.4% | 2.0% | 2.1% |
| JIS-D hardness at 23° C. when swollen to saturation with warm water at 50° C. | | 67 | 68 | 68 | 68 | 67 |
| Contact angle after elapse of 15 minutes [degrees] | | 46 | 47 | 46 | 46 | 47 |
| Polishing rate [nm/min] | | 294 | 277 | 284 | 318 | 307 |
| Scratches | | Absent | Present | Absent | Present | Absent |
| Step Height [nm] | | 105 | 110 | 110 | 100 | 105 |

The results in Table 4 demonstrate the following. The polishing layers using the polyurethanes obtained in Examples 22 to 25, which had a terminal group having in which the number of repeated units n of oxyethylene was in the range of 8 to 120, had a low contact angle with water despite having a low saturated water absorption rate when immersed in water at 50° C. Accordingly, these polishing layers exhibited high surface hydrophilicity, high polishing rate, low-scratch property, and high planarization performance, while the softening thereof by water absorption was kept suppressed. On the other hand, the polishing layers using the polyurethanes obtained in Comparative Examples 13 to 15, which did not have a terminal group having polyoxyethylene, and polishing layers using the polyurethanes obtained in Comparative Examples 16 to 19, in which the number of repeated units n of oxyethylene was less than 8, had a high contact angle with water. Accordingly, these polishing layers had low surface hydrophilicity, a lower polishing rate, and were inferior in planarization performance and low-scratch property.

INDUSTRIAL APPLICABILITY

A polyurethane, a molded body for use in a polishing layer, and a polishing pad according to the present invention are useful in polishing applications for a semiconductor substrate, a glass, and the like. In particular, they are suitably used when performing chemical mechanical polishing on a semiconductor and a substrate material of a hard disk, a liquid crystal display and the like, or an optical component such as a lens and a mirror.

The invention claimed is:

1. A polishing layer that is a molded body of a polyurethane comprising:
a terminal group represented by formula (I):

$$R-(OX)_n- \quad (I)$$

wherein
R represents a monovalent hydrocarbon group having 1 to 30 carbon atoms that are optionally substituted with a heteroatom or are optionally interrupted by a heteroatom,
X represents an alkylene group having 2 to 4 carbon atoms, 90 to 100% of the alkylene group being an ethylene group, and
n represents a number from 8 to 120.

2. The polishing layer according to claim 1, wherein the polishing layer is non-porous.

3. The polishing layer according to claim 1, wherein the polishing layer has a JIS-D hardness at 23° C. when immersed in warm water at 50° C. for 72 hours, of 45 to 75.

4. A polishing pad, comprising:
the polishing layer according to claim 1, and
a cushioning layer having a hardness lower than a hardness of the polishing layer.

5. The polishing layer according to claim 1, wherein R in the formula (I) is an aliphatic hydrocarbon group having 1 to 22 carbon atoms.

6. The polishing layer according to claim 1, wherein n in the formula (I) is 15 to 100.

7. The polishing layer according to claim 1, wherein the polyurethane contains 0.005 to 0.05 mmol/g of the terminal group represented by the formula (I).

8. The polishing layer according to claim 1, wherein the polyurethane contains 1 to 10 mass % of the terminal group represented by the formula (I).

9. The polishing layer according to claim 1, wherein the polyurethane is a reaction product of an organic polyisocyanate (A), a polymer polyol (B), a chain extender (C), and a compound (D) represented by formula (II):

$$R-(OX)_n-A_H \quad (II)$$

wherein
R, X, and n are the same as those in the formula (I), and
$A_H$ is a hydroxyl group, an amino group, or a monovalent hydrocarbon group having 1 to 4 carbon atoms and containing a hydroxyl group or an amino group.

10. The polishing layer according to claim 9, wherein the polyurethane has a ratio of nitrogen atoms derived from an isocyanate group of the organic polyisocyanate (A), of 4.6 to 6.8 mass %.

11. The polishing layer according to claim 9, wherein a number-average molecular weight of the polymer polyol (B) is 600 to 2000.

12. The polishing layer according to claim 9, wherein the polymer polyol (B) contains 70 mass % or more of polytetramethylene glycol.

13. The polishing layer according to claim 1, wherein the polyurethane has a water absorption rate when swollen to saturation with warm water at 50° C., of 3% or less.

14. The polishing layer according to claim 1, wherein the polyurethane has thermoplasticity.

* * * * *